United States Patent

Lee

[11] Patent Number: 5,299,632
[45] Date of Patent: Apr. 5, 1994

[54] FIN DEVICE FOR AN INTEGRATED CIRCUIT

[76] Inventor: Lien-Jung Lee, No. 254, Chung Cheng Rd., Lo Jou Hsiang, Taipei Hsien, Taiwan

[21] Appl. No.: 19,967

[22] Filed: Feb. 19, 1993

[51] Int. Cl.⁵ .............................................. H01L 23/40
[52] U.S. Cl. .................................. 165/80.3; 165/121; 165/185; 361/697; 24/563; 248/316.7
[58] Field of Search ....................... 165/80.3, 121, 185; 361/384, 697; 24/295, 569, 570, 563; 248/231.8, 316.7, 680, 681

[56] References Cited

U.S. PATENT DOCUMENTS

| | | | |
|---|---|---|---|
| 2,246,720 | 6/1941 | Churchill | 24/295 X |
| 2,305,122 | 12/1942 | Wiley | 24/295 X |
| 2,665,869 | 1/1954 | Samuels | 248/231.8 X |
| 2,916,113 | 12/1959 | Lee | 24/563 X |
| 4,022,272 | 5/1977 | Miller | 165/185 X |
| 4,459,638 | 7/1984 | Brehm et al. | 165/80.3 X |
| 4,513,812 | 4/1985 | Papst et al. | 165/121 X |
| 4,575,038 | 3/1986 | Moore | 248/316.7 X |
| 4,587,595 | 5/1986 | Staples | 165/80.3 X |
| 4,592,643 | 6/1986 | Hermann | 165/185 X |
| 4,660,123 | 4/1987 | Hermann | 165/80.3 X |
| 4,804,172 | 2/1989 | Sokolovsky et al. | 165/80.3 X |
| 4,833,751 | 5/1989 | Iwase et al. | 24/563 X |
| 4,933,746 | 6/1990 | King | 165/80.3 X |
| 4,972,294 | 11/1990 | Moses, Jr. et al. | 165/80.3 X |
| 4,978,638 | 12/1990 | Buller et al. | 165/80.3 X |

Primary Examiner—John Rivell
Attorney, Agent, or Firm—Cooley Godward Castro Huddleson & Tatum

[57] ABSTRACT

A fin device includes a plate having a bottom surface for contacting an upper surface of an integrated circuit and an upper surface from which two opposite end walls extend upward. A plurality of rows of fins extend between the opposite end walls and extend upward from the upper surface of the plate. A substantially L-shaped member extends outward and upward from each fin of first and last rows which are adjacent to and extend parallel to the opposite end walls. Each L-shaped member extends to a height above the fins. The fins of the first and last rows respectively define a groove with associated adjacent end walls for receiving at least one snapping fastener. Each snapping fastener is substantially T-shaped, including a substantially inverted L-shaped portion with a distal snapping head at an end thereof and two arms extending laterally from the other end thereof. The arms have a recessed portion at an underside thereof. The distal snapping head releasably engages with a bottom surface of the integrated circuit to retain a reliable contact of the bottom surface of the plate and the upper surface of the integrated circuit. A fan is securely mounted on the L-shaped members in which a space is defined between the fins and the fan to increase the effect of heat dissipation.

3 Claims, 2 Drawing Sheets 5,299,632

FIN DEVICE FOR AN INTEGRATED CIRCUIT

BACKGROUND OF THE INVENTION

1. Field of the invention

The present invention relates to a fin device for an integrated circuit. The present invention also relates to an improved snapping fastener for securely mounting the fin device to the integrated circuit.

2. Description of the related prior art

Temperature is the most important factor to the normal operation of the integrated circuit. Currently, relatively large integrated circuits of microprocessors are made of ceramic material, whose temperature may reach above its boiling point if heat dissipation is not satisfactory, which affects the operation of the integrated circuits and sometimes further affects other elements.

To avoid the above-mentioned problem, devices have been developed, one type of which provides a fin plate of aluminum to dissipate the heat. The surface of the fin plate which contacts the surface of the integrated circuit is, even after grinding or polishing, not satisfactorily smooth, i.e., the two surfaces cannot be tightly secured against each other even though additional fasteners are provided, which seriously affect the heat dissipation efficiency.

An additional fan has been mounted above the fin plate to assist the dissipation of heat generated by integrated circuits. It is, however, found that the heat-dissipating effect is unsatisfactory. In addition, the fan is mounted on the fin plate by screws, which possibly damage the fins surrounding the screws. Furthermore, the screws may become loose as the fins are flexible.

Therefore, there has been a long and unfulfilled need for an improved fin device for an integrated circuit and an improved fastening means to secure the fin device and the integrated circuit together.

SUMMARY OF THE INVENTION

The present invention provides a fin device for dissipating heat generated by an integrated circuit and snapping fasteners for securely holding the fin device and the integrated circuit together, providing a reliable heat transfer contact relationship therebetween. The fin device is substantially a plate having two opposite end walls extending from an upper surface thereof. Between the end walls, a plurality of fins, arranged in a manner of matrix, extend upward from the upper surface of the plate whose bottom surface contacts the integrated circuit for dissipating heat. Preferably, the plate and the fins are integral and of aluminum or other material suitable to dissipate heat generated by the integrated circuit during operation.

A substantially L-shaped member extends outward and upward from each fin of the first and last rows which are adjacent to and extend parallel to the end walls. The L-shaped member extends to a sufficient height and has an upper ledge at a top portion thereof and a lower ledge at a mediate portion thereof. All of the upper and lower ledges together define a retaining means for securely retaining a fan. Preferably, the upper ledge may further serve as a snapping head and the L-shaped member is flexible so that the fan may be snapped downward into the compartment defined by the upper and lower ledges. The fins of the first and last rows respectively define a groove with associated adjacent end walls for receiving the snapping fastener.

The snapping fastener is substantially T-shaped, including a substantially inverted L-shaped portion with a distal snapping head at an end thereof and two arms extending laterally from the other end of the inverted L-shaped portion. Preferably, the arms have a recessed portion at an underside thereof. Due to the provision of the recess in the underside of the arms, after being snapped on to the integrated circuit and an upward force is thus exerted, the arms deform to balance the upward force, thereby securely holding the integrated circuit and the plate together, providing a reliable contact relationship therebetween.

Other objects, advantages, and novel features of the invention will become more apparent from the following detailed description when taken in conjunction with the accompanying drawings.

DETAILED DESCRIPTION OF THE PREFERRED EMBODIMENTS

Figure 1:
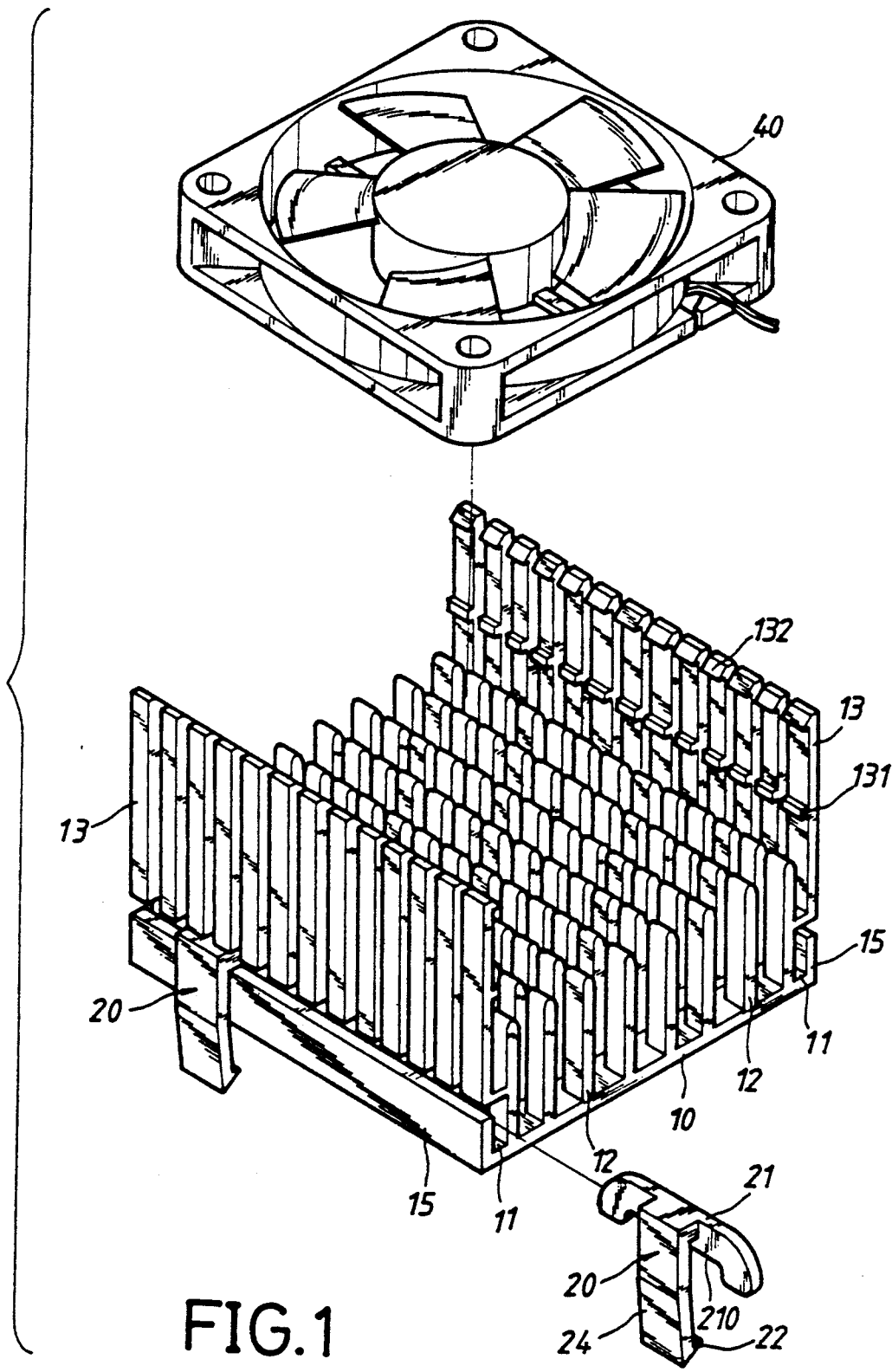
FIG. 1 is an exploded view of a fin device and a snapping fastener in accordance with the present invention.
Figure 2:
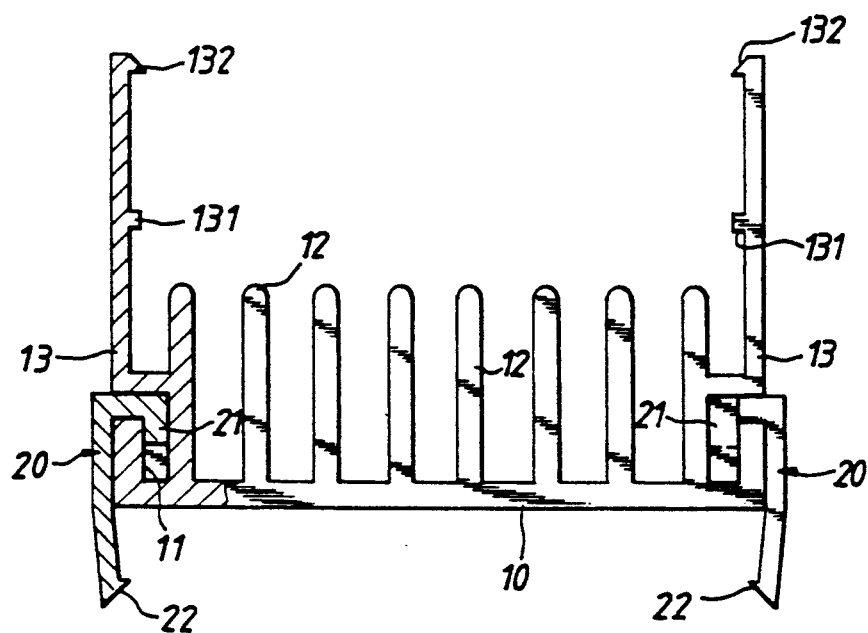
FIG. 2 is a side elevational view, partly in section, of the fin device and the snapping fastener in which the fan is omitted for clarity.
Figure 3:
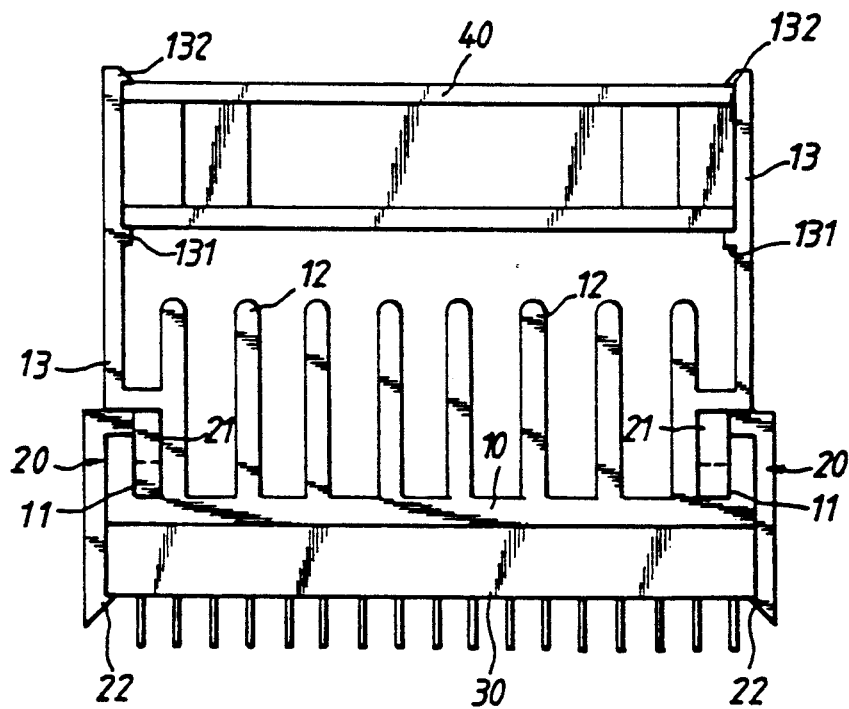
FIG. 3 is a side elevational view showing a preferred working embodiment of the present invention.

Referring to FIGS. 1 through 3, the present invention generally includes a fin device for dissipating heat generated by an integrated circuit 30 and snapping fasteners 20 for securely holding the fin device and the integrated circuit 30 together. The fin device is substantially a plate 10 having two opposite end walls 15 extending from an upper surface thereof. Between the end walls 15, a plurality of fins 12, arranged in a manner of matrix, extends upward from the upper surface of the plate 10 whose bottom surface contacts the integrated circuit 30 for dissipating heat. Preferably, the plate 10 and the fins 12 are integral and of aluminum or other material suitable to dissipate heat generated by the integrated circuit 30 during operation.

As clearly shown in the drawings, a substantially L-shaped member 13 extends outward and upward from each fin 12 of the first and last rows which are adjacent to and extend parallel to the opposite end walls 15. The L-shaped member 13 extends to a sufficient height and has an upper ledge 132 at a top portion thereof and a lower ledge 131 at a mediate portion thereof. All of the upper and lower ledges 131 together define a retaining means for securely retaining a fan 40. Preferably, the upper ledge 132 may further serve as a snapping head and the L-shaped member 13 is flexible so that the fan 40 may be snapped downward into the compartment defined by the upper and lower ledges 131 and 132. The fins 12 of the first and last rows respectively define a groove 11 with associated adjacent end wall 15 for receiving the snapping fasteners 20, which will be discussed later.

As shown in FIG. 1, each snapping fastener 20 is substantially T-shaped, including a substantially inverted L-shaped portion 24 with a distal snapping head 22 at an end thereof and two arms 21 extending laterally from the other end of the inverted L-shaped portion 24.

Preferably, the arms 21 have an recessed portion 210 at an underside thereof.

In use, the snapping fasteners 20 are laterally inserted into the grooves 11 to a desired position. Thereafter, the combination of the fin plate 10 and the snapping fasteners 20 are mounted to the integrated circuit 30 by snapping, such that the snapping heads 22 releasably yet securely engages with an underside of the integrated circuit and the bottom surface of the plate 10 reliably contacts the upper surface of the integrated circuit 30 to perform the heat dissipation function. Due to the provision of the recess 210 in the underside of the arms 21, after being snapped on to the integrated circuit and an upward force is thus exerted, the arms 21 deform upward to balance force, thereby securely holding the integrated circuit and the plate 10 together. Installation of the fan 40 may be the last step. As the fan 40 is sufficiently high above the fins 12 to define a space therebetween for air circulation, heat dissipation is found to be satisfactory.

Although the invention has been explained in relation to its preferred embodiment, it is to be understood that many other possible modifications and variations can be made without departing from the spirit and scope of the invention as hereinafter claimed.

I claim:

1. A fin device for dissipating heat generated by an integrated circuit comprising:

a plate (10) having a bottom surface for contacting an upper surface of an integrated circuit (30) and an upper surface, two opposite end walls (15) extending upward from said upper surface;

a plurality of rows of fins (12) extending between said end walls (15) and extending upward from said upper surface of said plate;

a substantially L-shaped member (13) extending outward and upward from each said fin (12) of first and last rows which are adjacent to and extend parallel to the end walls (15), each said L-shaped member (13) extending to a height above said fins, said fins (12) of said first and last rows respectively defining a groove (11) with associated adjacent said end walls (15) for receiving at least one snapping fastener (20), said snapping fastener (20) being substantially T-shaped, comprising a substantially inverted L-shaped portion (24) with a distal snapping head (22) at an end thereof and two arms (21) extending laterally from the other end thereof, said arms (21) having a recessed portion (210) at an underside thereof, said distal snapping head (22) releasably engaging with a bottom surface of said integrated circuit to reliably retain a heat transfer contact relationship of said bottom surface of said plate (10) and said upper surface of said integrated circuit;

a fan means (40); and means (131 and 132) for securely retaining said fan means on said L-shaped members, defining a space between said fins and said fan means.

2. The fin device as claimed in claim 1 wherein said retaining means comprises an upper ledge (132) at a top portion of each said L-shaped member and a lower ledge (131) at a mediate portion of each said L-shaped member.

3. The fin device as claimed in claim 2 wherein said L-shaped member has a snapping head at a top thereof.

* * * * *